(12) United States Patent
Ma et al.

(10) Patent No.: US 7,138,880 B2
(45) Date of Patent: Nov. 21, 2006

(54) TURBO-CHARGED RELAXATION OSCILLATOR METHOD AND APPARATUS

(75) Inventors: Ssu-Pin Ma, Taipei (TW); Shao-Hua Chen, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 11/117,321

(22) Filed: Apr. 29, 2005

(65) Prior Publication Data
US 2005/0242892 A1    Nov. 3, 2005

(30) Foreign Application Priority Data
Apr. 30, 2004    (TW) ................ 93112129 A

(51) Int. Cl.
*H03K 3/02*    (2006.01)
*H03K 3/26*    (2006.01)

(52) U.S. Cl. .................... 331/143; 331/111

(58) Field of Classification Search ........... 331/111, 331/113 R, 143, 144
See application file for complete search history.

(56) References Cited

U.S. PATENT DOCUMENTS

| | | | |
|---|---|---|---|
| 6,020,792 A | 2/2000 | Nolan et al. | 331/111 |
| 6,201,450 B1 | 3/2001 | Shakiba et al. | 331/111 |
| 6,362,697 B1 | 3/2002 | Pulvirenti | 331/111 |
| 6,456,170 B1* | 9/2002 | Segawa et al. | 331/143 |
| 6,680,656 B1* | 1/2004 | Chen | 331/143 |
| 7,053,724 B1* | 5/2006 | Rusu et al. | 331/143 |
| 2001/0045868 A1* | 11/2001 | Takeyabu et al. | 331/2 |

* cited by examiner

*Primary Examiner*—Robert Pascal
*Assistant Examiner*—James Goodley
(74) *Attorney, Agent, or Firm*—Troxell Law Office, PLLC

(57) ABSTRACT

A method for producing an oscillating signal comprises: generating an oscillating signal by discharging after charging to a high trigger level and charging after discharging to a low trigger level; and turbo-charging at the initial of a change-over from charging to discharging while resuming a normal charging/discharging thereafter, and vice versa. The present invention makes use of the turbo-charging/discharging for a linear compensation, such that the produced oscillating signal has the features of concurrently eliminating phase noises and jitters as well as maintaining the modulation linearity.

7 Claims, 6 Drawing Sheets

TURBO-CHARGED RELAXATION OSCILLATOR METHOD AND APPARATUS

FIELD OF THE INVENTION

The present invention relates to a method and apparatus for producing an oscillating signal, and more particularly to a method and an apparatus for producing an oscillating signal by turbo compensation.

BACKGROUND OF THE INVENTION

A common relaxation oscillator, such as a relaxation voltage/current controlled oscillator, is an oscillator circuit as seen in FIG. 1. In FIG. 1, the relaxation oscillator 100 mainly uses current sources 110, 120 to alternate the charge and discharge of a capacitor 130 so as to produce an oscillating signal at a node 140. That is, the voltage at the node 140 is inputted to the two comparators 150 and 160 while independent reference voltages, namely $V_H$ and $V_L$, are coupled to each of the remaining inputs of the comparators 150, 160. The outputs of each of the two comparators 150, 160 are respectively coupled to the inputs of a "Set-Reset type" flip-flop, that is, respectively to the S terminal and R terminal of the SR latch 170, which enables the SR latch 170 to output a control signal 180 from the Q terminal thereof for controlling the switch-over at node 140 between the power source 110 and the power source 120 and serving to alternately charge and discharge the capacitor 130.

As such, if the voltage at the node 140 is higher than the potential of the reference voltage $V_H$, then the node 140 will coupled to the input terminal of the power source 120 for enabling the discharging of the capacitor 130; and if the voltage across the node 140 is lower than the potential of the low voltage $V_L$, then the node 140 will coupled to the output terminal of the power source 110 for enabling the charging of the capacitor 130.

Please refer to FIG. 2 for an oscillating signal outputted from the relaxation oscillator 100. In FIG. 2, the voltage of an oscillating signal rises with the time during a charging process, and, as the voltage reaches a high trigger level ($V_H$), a discharging process will be triggered and the voltage of the oscillating signal starts to drop with the time. However, since each component in the relaxation oscillator 100 has a so-called response time, particularly the comparator 150, 160, therefore the discharging process cannot be activated immediately when the voltage of the oscillating signal reaches the high trigger level ($V_H$), and the charging continues for a period of time enabling the voltage of the oscillating signal to exceed the high trigger level ($V_H$).

Therefore, the waveform of the oscillating signal outputted by the relaxation oscillator 100 will exceed the high trigger level ($V_H$) and delay for some time before the waveform starts dropping. Similarly, it will drop beyond the low trigger level ($V_L$) and delay for some time before the waveform starts rising.

Please refer to FIG. 3 for an enlarged diagram of a section of the waveform of an oscillating signal produced by a prior-art relaxation oscillator. In FIG. 3, the oscillating signal rises with a slope R1 and has a time delay $t_d$ after passing the high trigger level ($V_H$) before reaching its highest peak. Similarly, as the waveform falls from its maximum value at a slope which may or may not equal –R1, there is e another time delay $t_d'$ (which may or may not equal $t_d$) before it reaches the high trigger level ($V_H$) again.

As the waveform of the oscillating signal with a time delay for the capacitor 130 in the relaxation oscillator 100 can average out some of the noises produced by the output of the comparators 150, 160, the phase noise and jitter of the oscillating signal is reduced. However, the existence of the time delay will make the frequency of the oscillating signal not directly proportional to the current supplied by the current sources 110, 120, which will adversely affect the modulation linearity.

Therefore, the oscillating signal produced by the relaxation oscillator cannot have a waveform capable of concurrently eliminating the phase noise and jitter and solving the modulation linearity problem.

In view of the description above, the present invention discloses a method and an apparatus for producing an oscillating signal to effectively overcome the shortcomings of the oscillating signal outputted by a prior-art relaxation oscillator that has phase noises, jitters and modulation linearity problem.

SUMMARY OF THE INVENTION

The primary object of the invention is to provide a method for producing an oscillating signal that comprises: generating an oscillating signal by discharging after charging to a high trigger level and charging after discharging to a low trigger level; and turbo-charging at the initial of a changeover from charging to discharging while resuming a normal discharging thereafter, and vice versa In a preferred embodiment of the present invention, the oscillating signal has a waveform with a fixed ratio of the slope of a normal discharge to the slope of an turbo-discharging, and the fixed ratio is determined by the waveform of a simulated oscillating signal during a normal charging and discharging without going through a time delay.

Another object of the present invention is to provide an apparatus for producing an oscillating signal, which comprises a relaxation oscillator and a charge/discharge current control circuit, wherein the relaxation oscillator outputs an oscillating signal by a alternating charging/discharging and a voltage comparison method and the charge/discharge current control circuit is provided for regulating the current provided to the relaxation oscillator for charging/discharging.

In a preferred embodiment of the present invention, the relaxation oscillator comprises a latch logic gate, a first comparator, a second comparator, a capacitor, a first current source and a second current source; wherein the latch logic gate, the first comparator, the second comparator separately, each has a first input terminal, a second input terminal and an output terminal.

The second input terminal of the first comparator is coupled to a high voltage, and the output terminal of the first comparator is coupled to the first input terminal of the latch logic gate. The first input terminal of the second comparator is coupled to a low voltage, and the second input terminal of the second comparator is coupled to a node at the first input terminal of the first comparator, and the output terminal of the second comparator is coupled to the second input terminal of the latch logic gate.

The capacitor has a first terminal and a second terminal, and the first terminal of the capacitor is coupled to the node and the second terminal of the capacitor is coupled to a ground.

The first current source and the second current source separately have an input terminal and an output terminal. The input terminal of the first current source is coupled to a reference voltage, and the output terminal of the second current source is coupled to a ground. A signal outputted from the output terminal of the latch logic gate controls the foregoing node to be coupled to the output terminal of the first current source and the input terminal of the second current source.

The charge/discharge current control circuit comprises a third current source, a fourth current source and an electronic switch. The third current source and the fourth current source separately have an input terminal and an output terminal. The input terminal of the third current source is coupled to a reference voltage, and the output terminal of the third current source is coupled to the output terminal of the first current source. The output terminal of the fourth current source is coupled to a ground, and the input terminal of the fourth current source is coupled to the input terminal of the second current source.

An electronic switch controls and selects an electric connection of the third current source and the fourth current source according to a signal outputted from the input terminals of the first comparator and the second comparator.

In summation of the description above, the present invention provides a method and an apparatus for producing an oscillating signal and uses an accelerated charge/discharge compensation method to overcome the shortcomings of a prior-art relaxation oscillator that outputs an oscillating signal having phase noises and jitters and modulation linearity problem.

DESCRIPTION OF THE PREFERRED EMBODIMENT

Since the components inside a prior-art relaxation oscillator has a response time, therefore the waveform of an oscillating signal produced by a prior-art relaxation oscillator will go beyond the high trigger level and the low trigger level.

If the delay time of an oscillating signal is shortened when the waveform still indicates a time delay and the simulated waveform of the oscillating signal occurs at the ideal path, then the invention will concurrently achieve the effects of eliminating the phase noise and jitter and maintaining good modulation linearity.

If a larger charging/discharging current is provided at an initial charge/discharge stage of a relaxation oscillator according to the present invention, which accelerates the charge/discharge, the waveform of an ideal simulated oscillating signal follows the normal charge/discharge path after passing through the high trigger level and the low trigger level. After the normal charge/discharge is resumed, some part of the waveform produced by the oscillating signal at the delay time can be maintained.

Therefore, the present invention can concurrently have the advantages of improving the modulation linearity and eliminating the phase noises and jitters.

To further illustrate the objectives, functions and technical characteristics of the present invention, we use a preferred embodiment together with the attached drawings for the detailed description for the invention.

Figure 1:
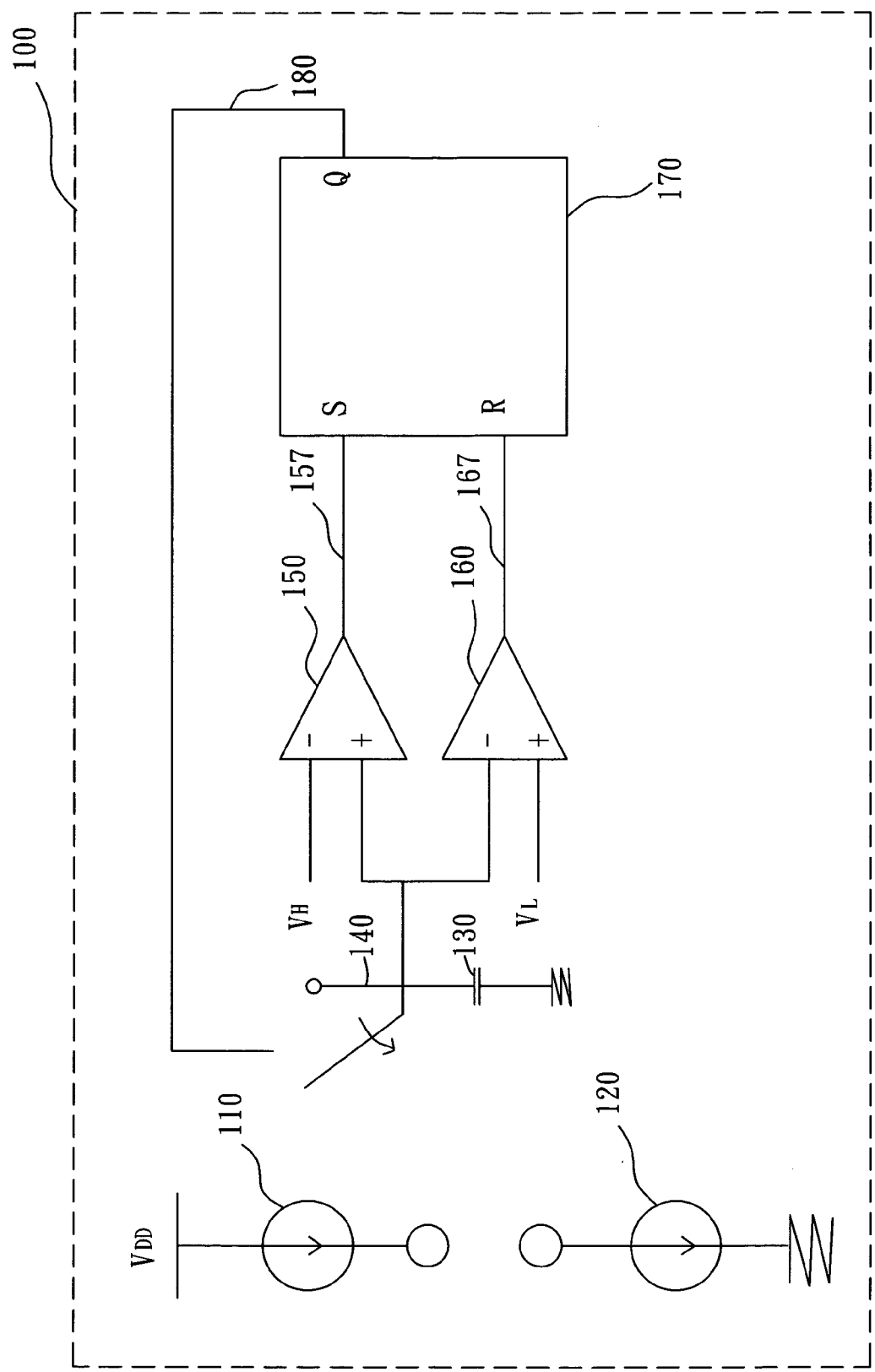
FIG. 1 is a schematic circuit diagram of a prior-art relaxation oscillator.
Figure 2:
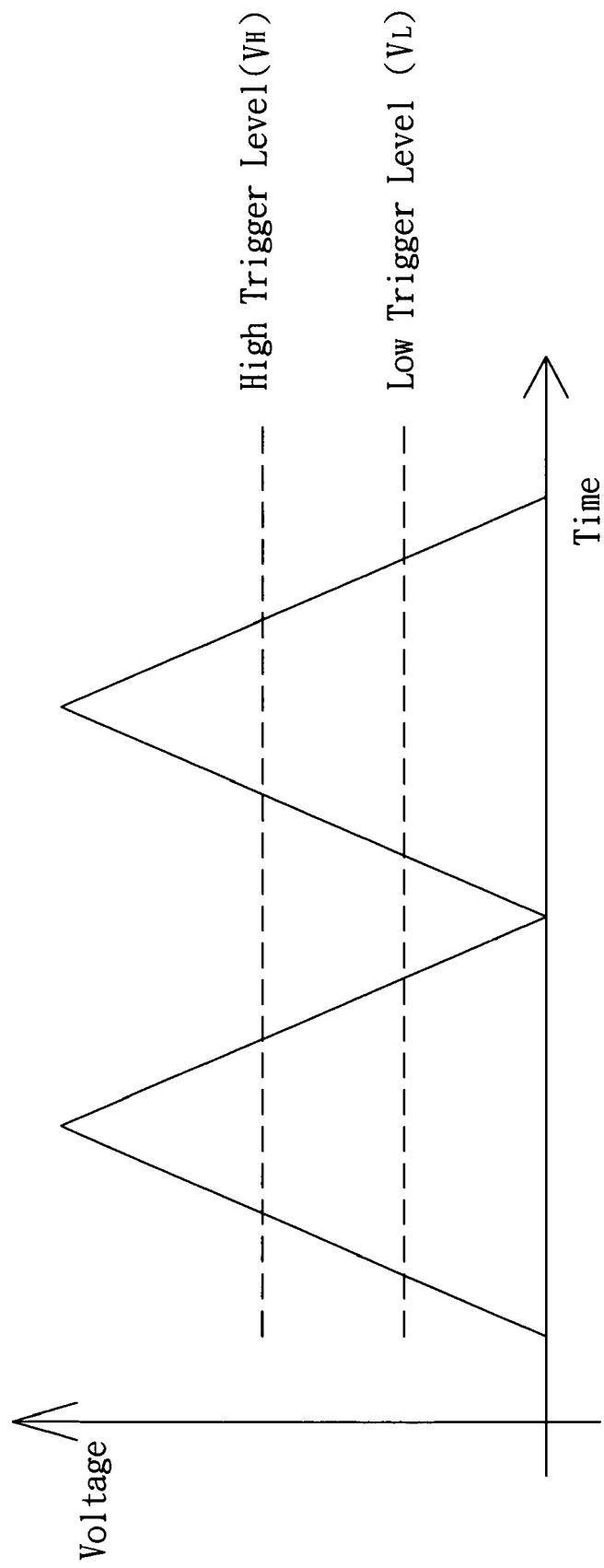
FIG. 2 is a schematic waveform diagram of a prior-art relaxation oscillator.
Figure 3:
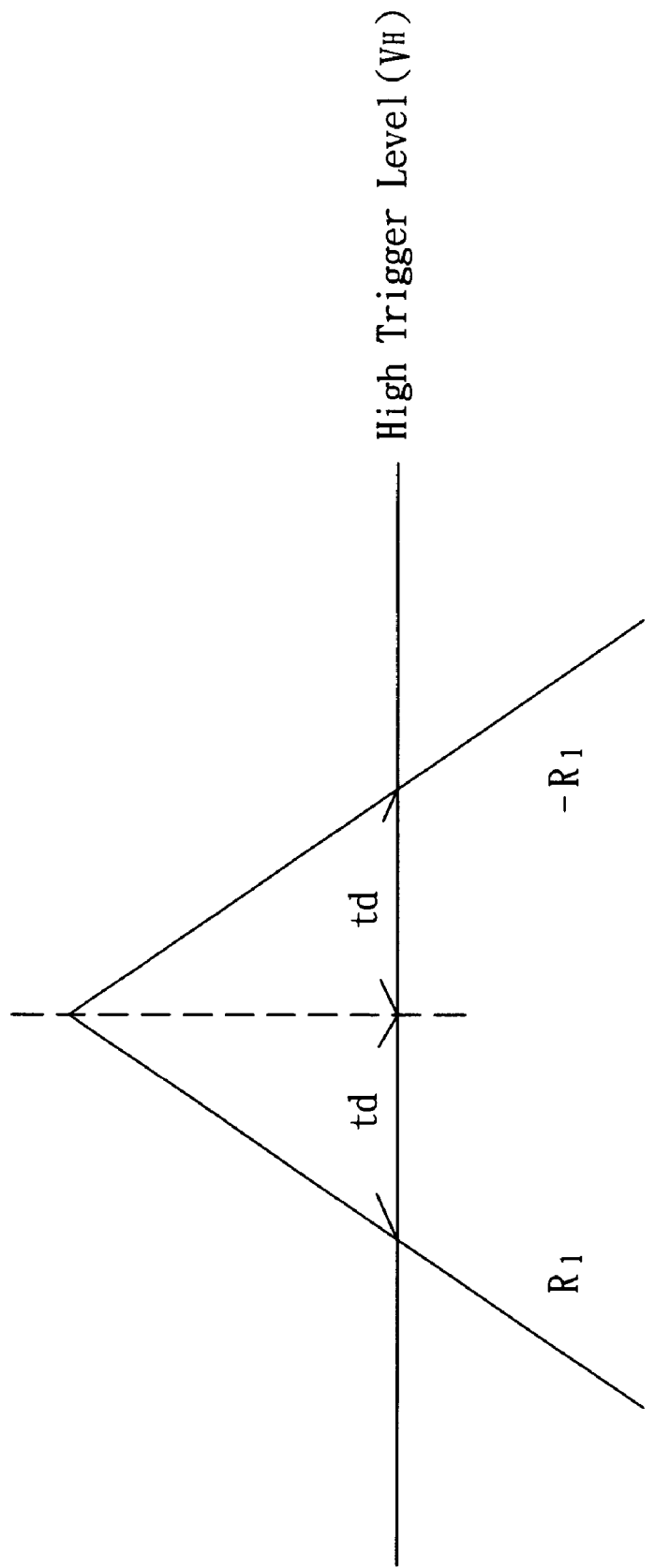
FIG. 3 is an enlarged view of a waveform of an oscillating signal produced by a prior-art oscillator.
Figure 4:
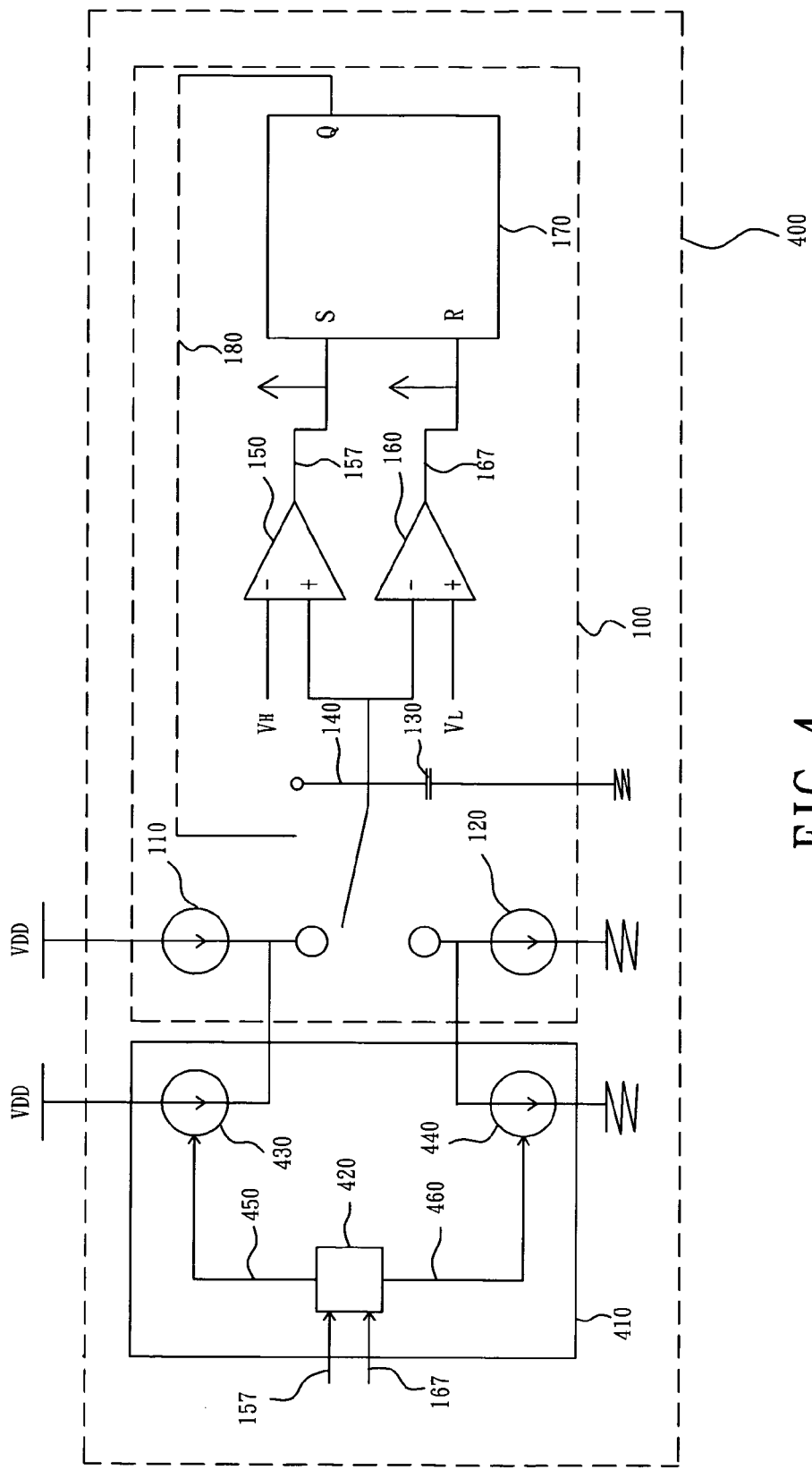
FIG. 4 is a schematic view of an apparatus for producing an oscillating signal according to a preferred embodiment of the present invention.

Please refer to FIG. 4 for the schematic view of an apparatus for producing an oscillating signal (or an oscillator signal generator) according to a preferred embodiment of the present invention. In FIG. 4, the oscillator signal generator 400 adopts the architecture of a traditional relaxation oscillator 100, and adds a charge/discharge control circuit 410 for increasing the charging/discharging current at the initial charge/discharge stage of the relaxation oscillator 100 to achieve the accelerated charging/discharging effect at the initial charge/discharge stage.

The charge/discharge control circuit comprises an electronic switch 420 and a current sources 430, 440; wherein the electronic switch 420 is similar to a latch logic gate 170 that uses comparators 150, 160 to output signals 157, 167 respectively as a basis for determining the output of the control signals 450, 460 for controlling the electric connection to the current sources 430, 440.

If the voltage at the node 140 is higher than the high trigger level ($V_H$), the latch logic gate 170 will use a control signal 180 to control the node 140 to couple with the input terminal of the current source 120, while the electronic switch 420 uses a control signal 460 to control the electric connection to the current source 440. Therefore, if the voltage of the node 140 is higher than the high trigger level ($V_H$), the parallel connected current sources 430, 110 will supply current to the capacitor 130 for the discharge.

Similarly, if the voltage of the node 140 is lower than the low trigger level ($V_L$), then the parallel connected current sources 430, 110 will simultaneously supply current to the capacitor 130 for the discharge.

It should be noted that the control of the current sources 430, 440 by the electronic switch 420 is based on the signals 157, 167 respectively. In other words, the high/low potential of the signal 157 will determine whether or not the current source 430 is electrically connected and the high/low potential or the signal 167 will determine whether or not the current source 440 is electrically connected. Therefore, if the voltage of the node 140 higher than the high trigger level ($V_H$) drops to the high trigger level ($V_H$), the electronic switch 420 will stop the electric connection with the current source 440 while the current source 120 continues supplying current to the capacitor 130 for the charging. If the voltage of the node 140 lower than the low trigger level ($V_L$) rises to the low trigger level ($V_L$), the electronic switch 420 will stop the electric connection with the current source 430 while the current source 110 continues supplying current to the capacitor for the discharge.

Therefore, the oscillator signal generator 440 can accelerate the charge/discharge at the initial charging/discharging stage, and resume the normal charge/discharge thereafter.

Figure 5:
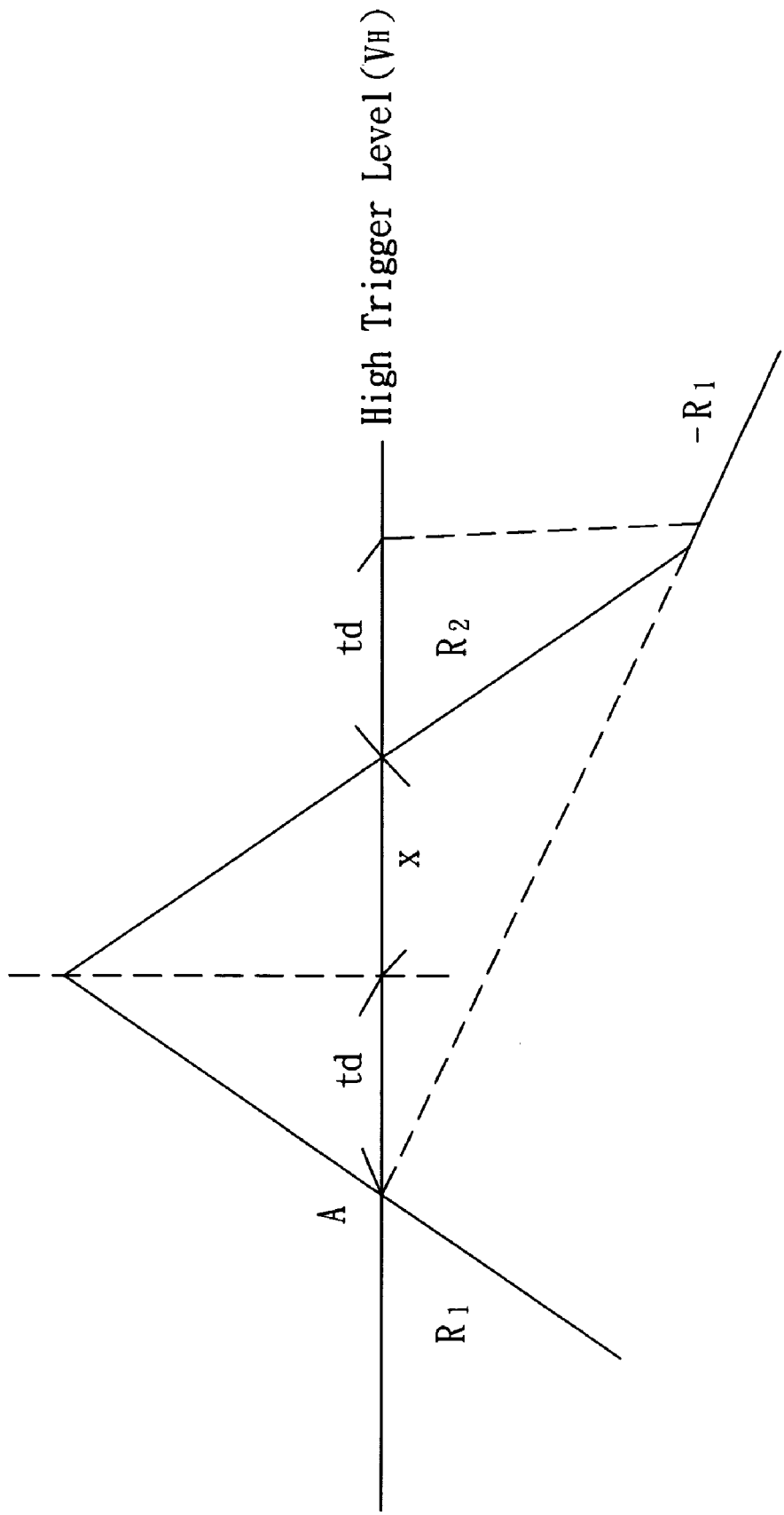
FIG. 5 is a schematic view of a section of an oscillating signal outputted by an apparatus for producing an oscillating signal according to the present invention.

Please refer to FIG. 5 for the schematic view of a section of an oscillating signal outputted from the oscillating signal generator according to the present invention. In FIG. 5, if the waveform of an oscillating signal rises with a slope R1 and its voltage potential is higher than the high trigger level ($V_H$), then the oscillating signal generator 400 will start accelerating the discharge. However, the oscillating signal generator 400 actually starts discharging at a delay time $t_d$ caused by the response of the components inside the oscillating signal generator 400. Therefore, the waveform of the oscillating signal will drop with a slope R2 after a delay time $t_d$.

If the voltage of the oscillating signal is lower than the high trigger voltage ($V_H$) after the waveform of the oscillating signal has dropped with a slope R2 and a time X has passed, the oscillating signal generator 400 will stop accelerating the discharge and switch to the normal discharge. However, the actual time for the oscillating signal generator 400 to stop accelerating the discharge and switch to the normal discharge takes place after a delay time $t_d'$. Therefore, the waveform of the oscillating signal drops with a slope R2 and the time X plus the delay time $t_d'$ have passed before the waveform continues dropping with a slope R1'. In general, $t_d'$ may not be equal to $t_d$ and R1' may not be equal to −R1. In the following, as an illustrating but not restricting example, $t_d'$ is assumed to be equal to $t_d$ and R1' is assumed to be equal to −R1.

In FIG. 5, if the ratio of slope R1 to slope R2 is fixed, the dotted line of the oscillating signal at the area with a slope −R1 will be intersected with the oscillating signal at the area with a slop R1 at Point A of the high trigger level ($V_H$). Coincidentally, the waveform composed of the oscillating signals at the areas with slopes R1, −R1 and the extended dotted line of the oscillating signal in the area with a slope −R1 is an ideal path for the waveform of the prior-art oscillating signal without taking the delay time $t_d$ into consideration.

The frequency of the oscillating signal produced by the oscillating signal generator 400 according to the present invention is equivalent to that of the oscillating signal produced under the condition of having no delay time $t_d$.

Therefore, the oscillating signal produced according to the present invention still has the waveform produced at the high trigger level ($V_H$) with a delay time $t_d$ so as to eliminate phase noises and jitters. The frequency of the oscillating signal produced according to the present invention is not related to the delay time $t_d$ so as to achieve the best modulation linearity. Further, the result of the frequency of the oscillating signal being irrelevant with the delay time $t_d$ can further lower the process sensitivity, which is very useful practically.

Figure 6:
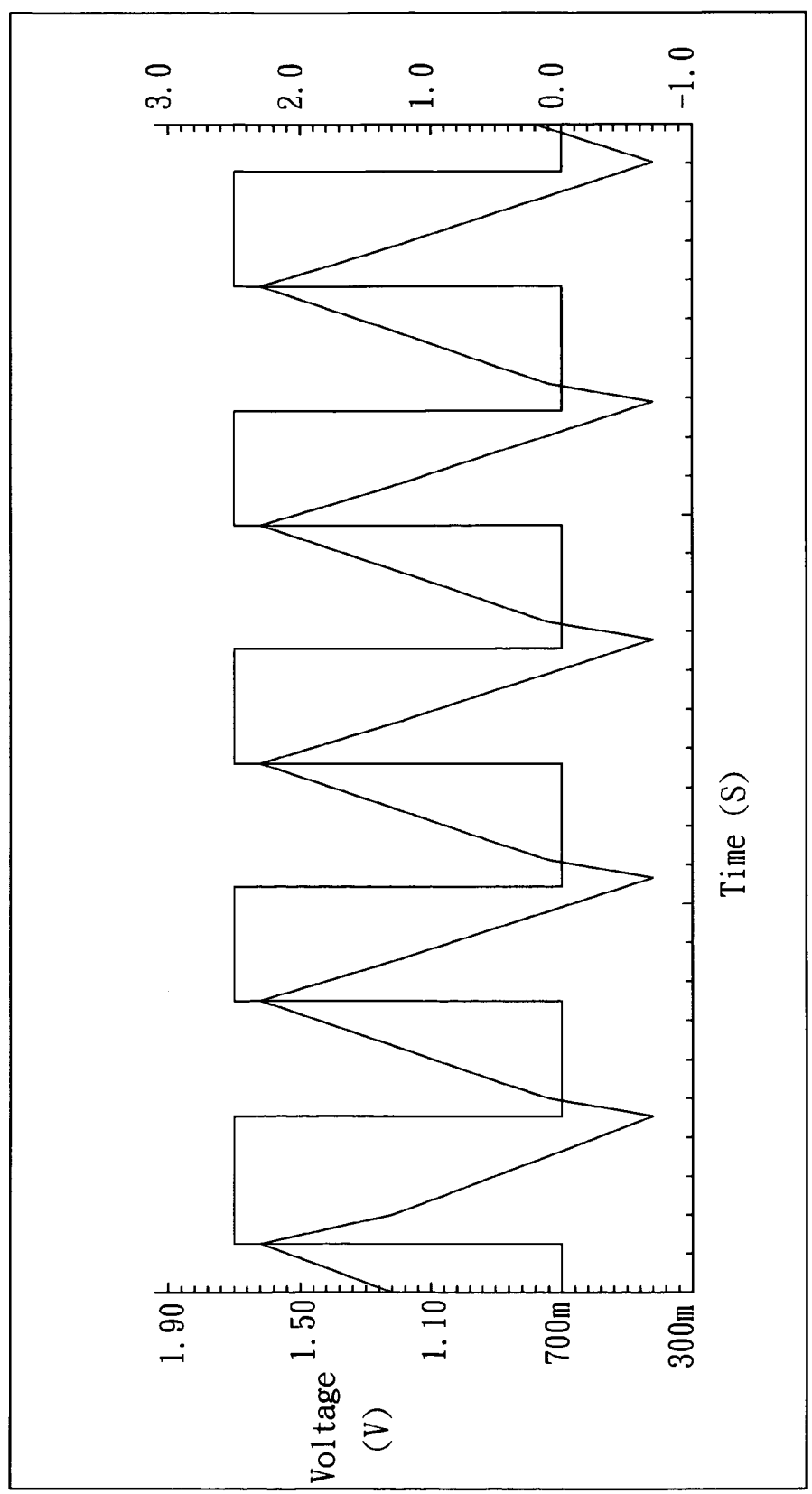
FIG. 6 is a schematic view of a waveform outputted from an 8 MHz oscillator according to a preferred embodiment of the present invention.

The invention can be applied to an 8 MHz oscillator successfully. Please refer to FIG. 6 for a schematic view of the waveform outputted by an 8 MHz oscillator according to a preferred embodiment of the present invention. In FIG. 6, the section of the accelerated oscillating signal can be observed easily.

In summation of the description above, the present invention provides a method and an apparatus for producing an oscillating signal by accelerating the charge/discharge at the initial charging/discharge stage to achieve the linear compensation effect. Since the oscillating signal produced according to the present invention still has the waveform with a time delay, and its frequency is not related to the time delay, therefore the oscillating signal produced according to the present invention can simultaneously have low phase noises and jitters as well as the best modulation linearity. As a result, the oscillating signal generator of the present invention can further lower the process sensitivity, which is very useful practically.

What is claimed is:

1. An apparatus for producing an oscillating signal, comprising:
   a relaxation oscillator, for outputting an oscillating signal by alternating a charging process and a discharging process as well as a voltage comparison method; and
   a charge/discharge current control circuit, for regulating the current provided to the relaxation oscillator for charging/discharging, the charge/discharge current control circuit being configured to accelerate charging or discharging at an initial change-over between charging and discharging, while resuming a normal charging or discharging until the next initial change-over.

2. The apparatus for producing an oscillating signal of claim 1, wherein the relaxation oscillator comprises:
   a latch logic gate, having a first input terminal, a second input terminal, and an output terminal;
   a first comparator, having a first input terminal, a second input terminal, and an output terminal, the second input terminal thereof being coupled to a high voltage, the output terminal thereof being coupled to the first input terminal of the latch logic gate;
   a second comparator, having a first input terminal, a second input terminal, and an output terminal, the first input terminal thereof being coupled to a low voltage, the second input terminal thereof being coupled to the first input terminal of the first comparator by a node, the output terminal thereof being coupled to the second input terminal of the latch logic gate;
   a capacitor, having a first terminal and a second terminal, the first terminal thereof being coupled to the node, the second terminal thereof being coupled to the ground;
   a first current source, having an input terminal and an output terminal, the input terminal thereof being coupled to a reference voltage; and
   a second current source, having an input terminal and an output terminal, the output terminal thereof being coupled to the ground;
   wherein a signal outputted from the output terminal of the latch logic gate controls a connection of the node selectively to the output terminal of the first current source and the input terminal of the second current source.

3. The apparatus for producing an oscillating signal of claim 2, wherein the charge/discharge current control circuit comprises:
   a third current source, having an input terminal and an output terminal, the input terminal thereof being coupled to the reference voltage, and the output terminal thereof being coupled to the output terminal of the first current source;
   a fourth current source, having an input terminal and an output terminal, the output terminal thereof being coupled to the ground, the input terminal thereof being coupled to the input terminal of the second current source; and
   an electronic switch, for controlling an electric connection of the third current source and the fourth current source according to a signal outputted from the input terminals of the first comparator and the second comparator.

4. The apparatus for producing an oscillating signal of claim 3, wherein the latch logic gate is a Set-Reset type flip-flop.

5. A method for producing an oscillating signal, comprising:
- charging to a high trigger level;
- discharging to a low trigger level by accelerating discharging at an initial change-over between charging and discharging and then resuming normal discharging; and
- charging to a high trigger level by accelerating charging at the initial change-over between discharging and charging and then resuming normal charging until the next initial change-over from charging to discharging.

6. The method for producing an oscillating signal of claim 5, wherein the oscillating signal has a waveform with a fixed ratio of the slope of a normal discharging to the slope of accelerated discharging.

7. The method for producing an oscillating signal of claim 6, wherein the fixed ratio is determined by a waveform of a simulated oscillating signal that normally charges and discharges without going through a time delay.

* * * * *